United States Patent [19]

Badehi

[11] Patent Number: 5,716,759
[45] Date of Patent: Feb. 10, 1998

[54] METHOD AND APPARATUS FOR PRODUCING INTEGRATED CIRCUIT DEVICES

[75] Inventor: Pierre Badehi, Yehuda, Israel

[73] Assignee: Shellcase Ltd., Har Hotzvim, Israel

[21] Appl. No.: 602,853

[22] PCT Filed: Sep. 1, 1994

[86] PCT No.: PCT/EP94/02908

§ 371 Date: Jun. 17, 1996

§ 102(e) Date: Jun. 17, 1996

[87] PCT Pub. No.: WO95/06899

PCT Pub. Date: Mar. 9, 1995

[30] Foreign Application Priority Data

Sep. 2, 1993 [IL] Israel .......... 106892

[51] Int. Cl.⁶ .......... G03C 5/00
[52] U.S. Cl. .......... 430/313; 430/5; 437/80
[58] Field of Search .......... 430/5, 313; 437/80

[56] References Cited

U.S. PATENT DOCUMENTS

| | | | |
|---|---|---|---|
| 2,507,956 | 5/1950 | Bruno | 148/6.2 |
| 2,796,370 | 6/1957 | Ostrander | 148/6.2 |
| 2,851,385 | 9/1958 | Spruance | 148/6.2 |
| 3,623,961 | 11/1971 | Blok van Laer | 204/15 |
| 3,644,801 | 2/1972 | Sheldon | 317/235 |
| 3,719,981 | 3/1973 | Steitz | 29/423 |
| 3,908,262 | 9/1975 | Stein | 29/579 |
| 4,383,886 | 5/1983 | Nakamura | 156/659 |
| 4,784,721 | 11/1988 | Holmen | 156/647 |
| 4,794,092 | 12/1988 | Solomon | 437/51 |
| 4,862,249 | 8/1989 | Carlson | 357/80 |
| 4,900,695 | 2/1990 | Takahashi | 437/195 |
| 4,904,610 | 2/1990 | Shyr | 437/15 |
| 4,933,898 | 6/1990 | Gilberg | 365/53 |
| 4,971,930 | 11/1990 | Fusaroli | 437/217 |
| 4,984,358 | 1/1991 | Nelson | 29/830 |
| 4,992,908 | 2/1991 | Solomon | 361/400 |
| 5,043,251 | 8/1991 | Sonnenschein et al. | 430/297 |
| 5,104,820 | 4/1992 | Go | 437/51 |
| 5,106,455 | 4/1992 | Jacobsen et al. | 156/659.1 |
| 5,126,286 | 6/1992 | Chance | 437/203 |
| 5,135,890 | 8/1992 | Temple | 437/215 |
| 5,147,815 | 9/1992 | Casto | 437/51 |
| 5,171,716 | 12/1992 | Cagan | 437/211 |
| 5,185,290 | 2/1993 | Aoyagi et al. | 437/129 |
| 5,185,295 | 2/1993 | Goto | 437/226 |
| 5,240,588 | 8/1993 | Uehida | 205/125 |
| 5,266,833 | 11/1993 | Capps | 257/690 |
| 5,269,882 | 12/1993 | Jacobsen | 156/659.1 |
| 5,270,485 | 12/1993 | Jacobsen | 174/15.1 |
| 5,292,686 | 3/1994 | Riley | 437/173 |
| 5,376,235 | 12/1994 | Langley | 156/664 |
| 5,455,455 | 10/1995 | Badehi | 257/690 |
| 5,547,906 | 8/1996 | Badehi | 437/227 |

FOREIGN PATENT DOCUMENTS

| | | |
|---|---|---|
| 211609 | 2/1987 | European Pat. Off. . |
| 490739 | 6/1992 | European Pat. Off. . |
| 514888 | 11/1992 | European Pat. Off. . |
| 1591105 | 9/1970 | Germany . |
| 3830131 | 4/1989 | Germany . |
| 2-17644 | 1/1990 | Japan . |
| 2-191358 | 7/1990 | Japan . |
| 85/02283 | 2/1985 | WIPO . |
| 93/24956 | 12/1993 | WIPO . |

OTHER PUBLICATIONS

D. Richmond, Micro SMT Integrated Circuit Technical White Paper, Micro SMT, Inc., Jan. 25, 1993.

Robert Lefort, et al., Flip Chips Improve Hybrid Capability, Hybrid Circuit Technology, May 1990, pp. 44–46.

Japanese Abstracts vol. 7, No. 194 (E–195), 7 Jun., 1983, & JP, A, 58095862 (Mitsubishi).

Primary Examiner—Mark Chapman
Attorney, Agent, or Firm—Ladas & Parry

[57] ABSTRACT

A method for three dimensional lithography including the steps of providing a substrate (44) having surfaces extending in three dimensions and a light sensitive coating and illuminating the substrate via a mask (40) with light impinging on the surfaces at a non-perpendicular angle with respect thereto.

26 Claims, 9 Drawing Sheets

1
METHOD AND APPARATUS FOR PRODUCING INTEGRATED CIRCUIT DEVICES

FIELD OF THE INVENTION

The present invention relates to methods and apparatus for producing integrated circuit devices.

BACKGROUND OF THE INVENTION

An essential step in the manufacture of all integrated circuit devices is known as "packaging" and involves mechanical and environmental protection of a silicon chip which is at the heart of the integrated circuit as well as electrical interconnection between predetermined locations on the silicon chip and external electrical terminals.

At present three principal technologies are employed for packaging semiconductors: wire bonding, tape automatic bonding (TAB) and flip chip.

Wire bonding employs heat and ultrasonic energy to weld gold bonding wires between bond pads on the chip and contacts on the package.

Tape automatic bonding (TAB) employs a copper foil tape instead of bonding wire. The copper foil tape is configured for each specific die and package combination and includes a pattern of copper traces suited thereto. The individual leads may be connected individually or as a group to the various bond pads on the chip.

Flip chips are integrated circuit dice which have solder bumps formed on top of the bonding pads, thus allowing the die to be "flipped" circuit side down and directly soldered to a substrate. Wire bonds are not required and considerable savings in package spacing may be realized.

The above-described technologies each have certain limitations. Both wire bonding and TAB bonding are prone to bad bond formation and subject the die to relatively high temperatures and mechanical pressures. Both wire bond and TAB technologies are problematic from a package size viewpoint, producing integrated circuit devices having a die-to-package area ratio ranging from about 10% to 60%.

The flip-chip does not provide packaging but rather only interconnection. The interconnection encounters problems of uniformity in the solder bumps as well as in thermal expansion mismatching, which limits the use of available substrates to silicon or materials which have thermal expansion characteristics similar to those of silicon.

SUMMARY OF THE INVENTION

The present invention seeks to provide apparatus and techniques for production of integrated circuit device overcome many of the above limitations and provide integrated circuits of relatively smaller size and weight and enhanced electrical performance.

In applicant's pending PCT application PCT/EP92/02134 entitled Methods and Apparatus for Producing Integrated Circuit Devices filed Sep. 14, 1992, there appear various types of integrated circuit devices including devices having pads which extend over both planar and edge surfaces thereof.

The present invention seeks to provide methods and apparatus for three dimensional photolithography, which are particularly suited for producing the above-described integrated circuit devices using mask techniques.

There is thus provided in accordance with a preferred embodiment of the present invention a method for three dimensional lithography including the steps of providing a substrate having surfaces extending in three dimensions and a light sensitive coating and illuminating the substrate via a mask with light impinging on the surfaces at a non-perpendicular angle with respect thereto.

There is further provided in accordance with an embodiment of the present invention a method for photolithographic forming of metal areas on an integrated circuit device including the steps of providing an integrated circuit device substrate having surfaces extending in three dimensions and a light sensitive coating and illuminating the substrate via a mask with light impinging on the surfaces at a non-perpendicular angle with respect thereto.

There is also provided in accordance with a preferred embodiment of the present invention apparatus for three dimensional lithography including a light source for illuminating a substrate having surfaces extending in three dimensions and a light sensitive coating via a mask with light impinging on the surfaces at a non-perpendicular angle with respect thereto.

There is further provided in accordance with an embodiment of the present invention apparatus for photolithographic forming of metal areas on an integrated circuit device including a light source for illuminating an integrated circuit device substrate having surfaces extending in three dimensions and a light sensitive coating via a mask with light impinging on the surfaces at a non-perpendicular angle with respect thereto.

In accordance with a preferred embodiment of the present invention, the mask may be located in proximity exposure relationship with the substrate.

Alternatively, the mask may be spaced from the substrate and optical elements may be located between the mask and the substrate.

Further in accordance with a preferred embodiment of the present invention, there may be provided a camera for viewing the substrate prior to and during illumination thereof.

The illumination may be carried out by employing a square pyramidal prism reflecting light from a light source onto a plurality of mutually spaced mirrors, which in turn reflect light onto edges of the substrate.

Alternatively the mask comprises a plurality of reticles and the optical system comprises a plurality of projection lenses receiving light from the plurality of reticles and a plurality of folding mirrors receiving light from the plurality of projection lens and directing it onto edges of the substrate.

In accordance with a preferred embodiment of the invention, mask exposure of the substrate is carried out waferwise. Alternatively, exposure can be carried out on individual dice. As a further alternative, a plurality of individual dice may be arranged in an array similar to an array of dice on a wafer and may be exposed together in the same way as a wafer.

Different masks may be employed for each exposure. Alternatively the same mask may be used for multiple exposures or all exposures, provided that the mask is rotated appropriately for each exposure direction.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1:
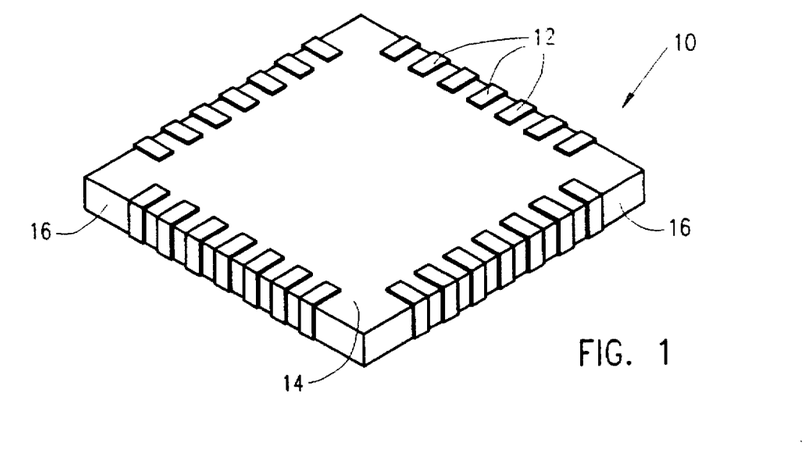
FIG. 1 is an illustration of an object, such as a semiconductor device having a patterned metal layer formed on surfaces thereof extending in three dimensions in accordance with a preferred embodiment of the present invention.

Reference is now made to FIG. 1, which is an example of an object 10, preferably, but not necessarily, an integrated circuit device, having a patterned metal coating 12 on surfaces thereof. In a preferred embodiment of the present invention, the object 10 includes a pair of opposite facing planar surfaces 14 and a plurality of edge surfaces 16, joining the planar surfaces 14.

In accordance with a preferred embodiment of the present invention, the patterned metal coating is formed simultaneously on at least one planar surface 14 and at least one edge surface 16. Preferably, the metal coating 12 is formed simultaneously on both planar surfaces 14 and on a plurality of edge surfaces 16, which surfaces extend in three dimensions.

Figure 2:
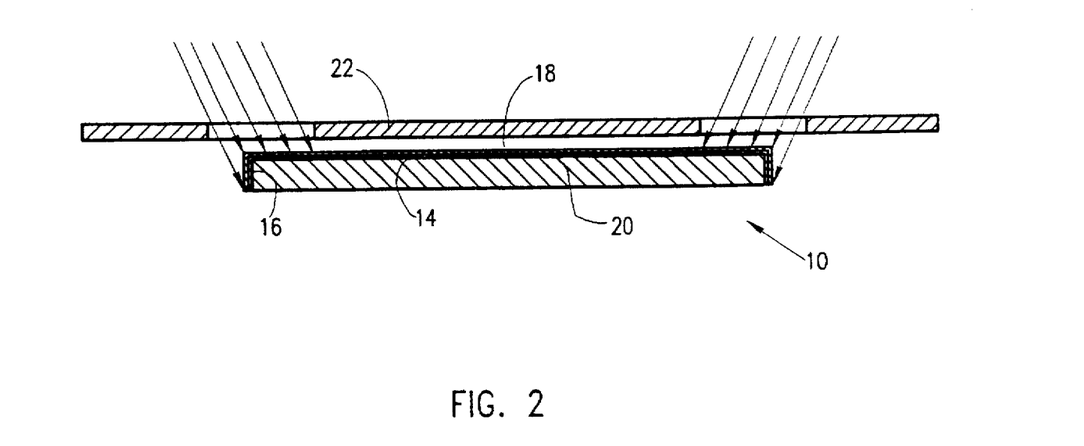
FIG. 2 is an illustration of angled impingement of light onto surfaces of a coated metal substrate through a mask in accordance with a preferred embodiment of the present invention.

Referring now to FIG. 2, it is seen that a layer 18 of a photosensitive coating, such as an electrodeposited photoresist is formed over a metal coating layer 20. The photoresist layer 18 is preferably exposed by light impinging at an angle which is not normal to any of surfaces 14 and 16, which passes through a mask 22. Preferably, the light impinges on both surfaces 14 and 16 at an angle within the general range of 10–80 degrees with respect to the normal thereto. A more preferred range of angles of impingement is 30–45 degrees. Most preferred angles of impingement are 30 and 45 degrees.

Figure 3:
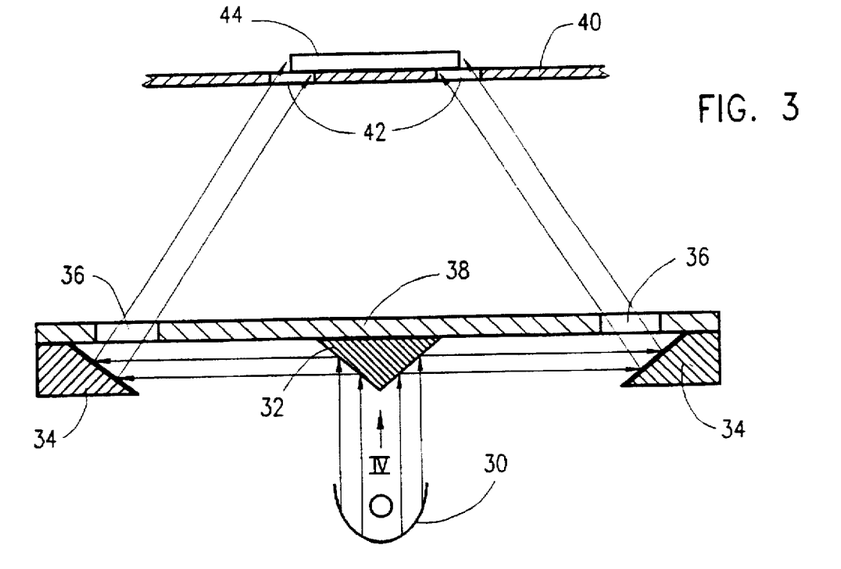
FIG. 3 is a simplified sectional illustration of apparatus for illuminating a substrate in accordance with one embodiment of the invention.
Figure 4:
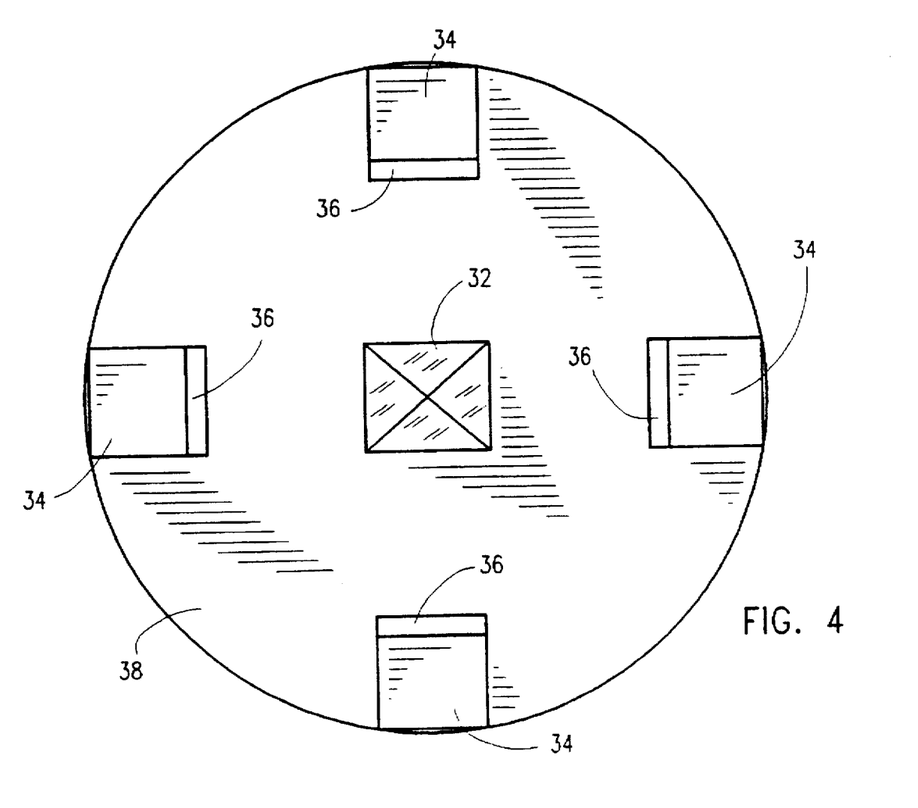
FIG. 4 is a plan view of the apparatus of FIG. 3 taken in the direction indicated by arrow IV in FIG. 3.

Reference is now made to FIGS. 3 & 4 which illustrate apparatus for providing the illumination illustrated in FIG. 2. A light source 30, such as a Xenon or Mercury lamp provides a generally collimated light beam which impinges on a metal coated square pyramidal prism 32. The four facets of prism 32 reflect the light from light source 30 onto four mirrors 34, which, in turn, reflect the light through apertures 36 in a support plate 38 onto a mask 40.

Mask 40 includes patterning apertures 42 which allow light to pass therethrough in proximity exposure engagement with the various surfaces of a substrate 44, much in the manner illustrated in FIG. 3. "Proximity exposure" as used throughout the specification and claims is defined as contact or near contact exposure.

Figure 5:
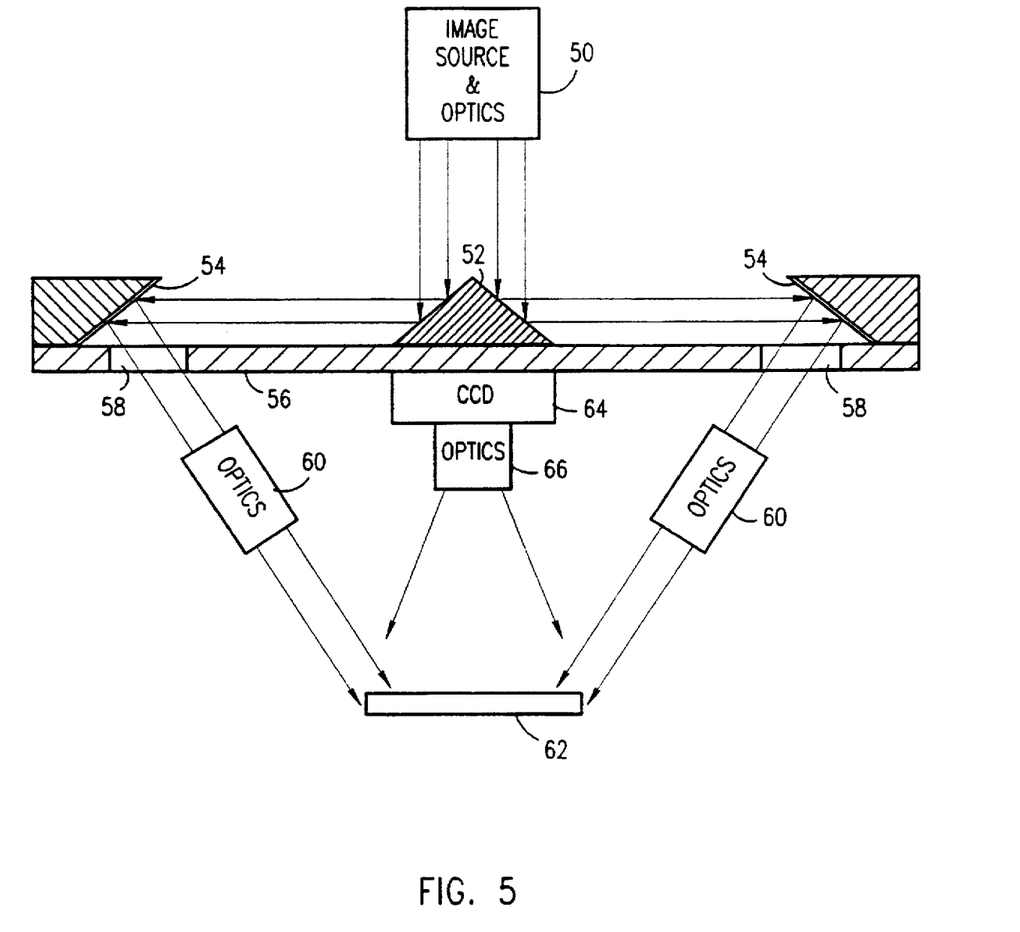
FIG. 5 is a simplified sectional illustration of apparatus for illuminating a substrate in accordance with another embodiment of the invention.

Reference is made to FIG. 5, which illustrates an alternative embodiment of the present invention wherein four images are projected by an image source and optics 50 onto a pyramidal prism 52 which reflects each of the four images in a separate direction simultaneously onto four respective folding mirrors 54 which may be mounted onto a base 56.

The four folding mirrors 54 each direct a beam of light through a corresponding aperture 58 and through focusing optics 60 onto a different edge surface of an object 62 and a portion of the planar surface adjacent thereto.

A sensor, such as a CCD sensor 64, views the object 62 through viewing optics 66 and provides a feedback indication of proper registration of each of the four images on the object. The sensor output may be used by an automatic inspection device or system or alternatively may provide a human visible output to an inspector.

Figure 6:
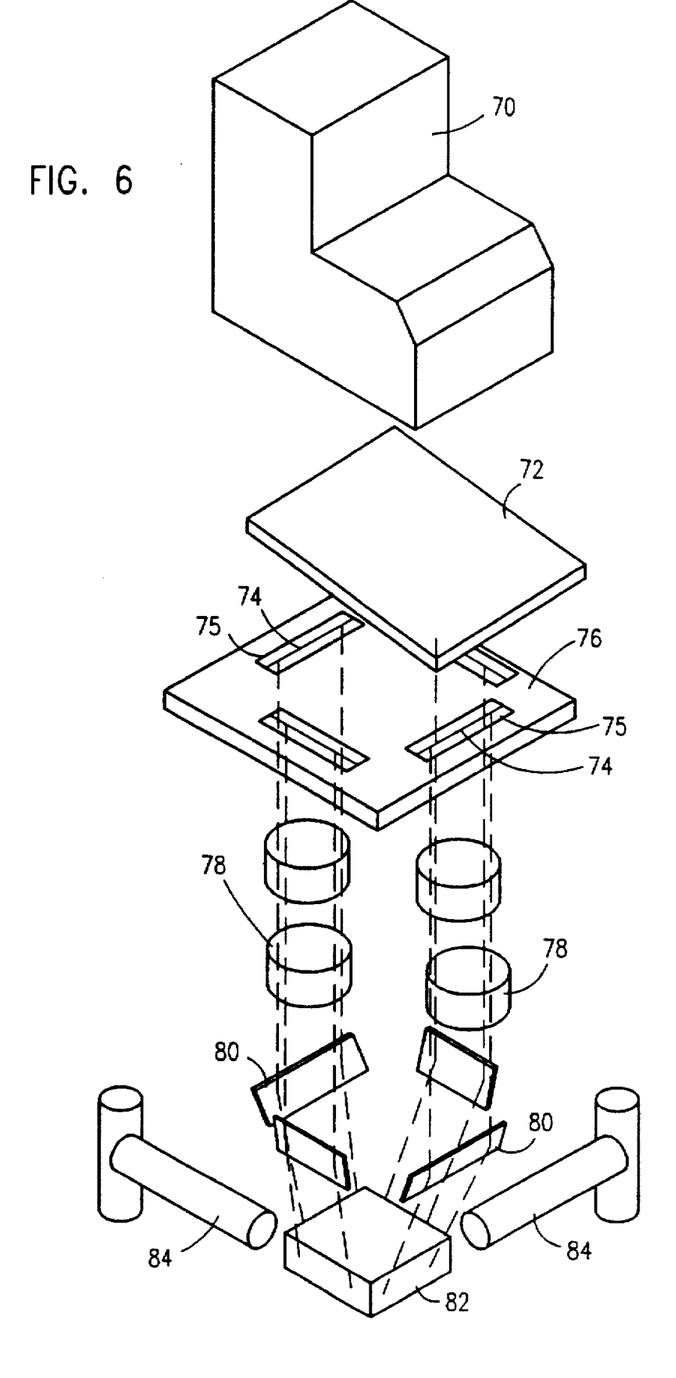
FIG. 6 is a simplified sectional illustration of apparatus for illuminating a substrate in accordance with yet another embodiment of the invention.

Reference is now made to FIG. 6, which illustrates a further alternative embodiment of the invention. Here an illuminator 70, such as a 130 mm square UV light source commercially available from Jerry Bachur and Associates (JBA) of San Jose, Calif., U.S.A. provides a spatially uniform high intensity UV light output via a UV filter 72, preferably having a peak transmission at 365 microns, also commercially available from JBA.

The filtered UV light passes through four discrete reticles 74, each disposed on a reticle stage 75 along a side of a rectangle defined on a reticle stage support 76. The reticles are commercially available from Compugraphics of Scotland and the reticle stage 75 is commercially available from Newport Corp. of the U.S.A.

The patterned light from each reticle 74 passes through a f/22 projection lens 78 preferably having 1:1 magnification, commercially available from Janos Technology Inc. of Townsend, Vt. U.S.A.. Light from each of lenses 78 is reflected by a folding mirror 80 so as to impinge on onto a different edge surface of an object 82 and a portion of the planar surface adjacent thereto.

Proper registration of the patterned light onto the object 82 may be monitored using one or more microscopes 84, each of which preferably examines one corner of the object.

Reference is now made to FIGS. 7A–10D, which illustrate waferwise three dimensional lithography in accordance with a preferred embodiment of the invention.

Figure 7A:
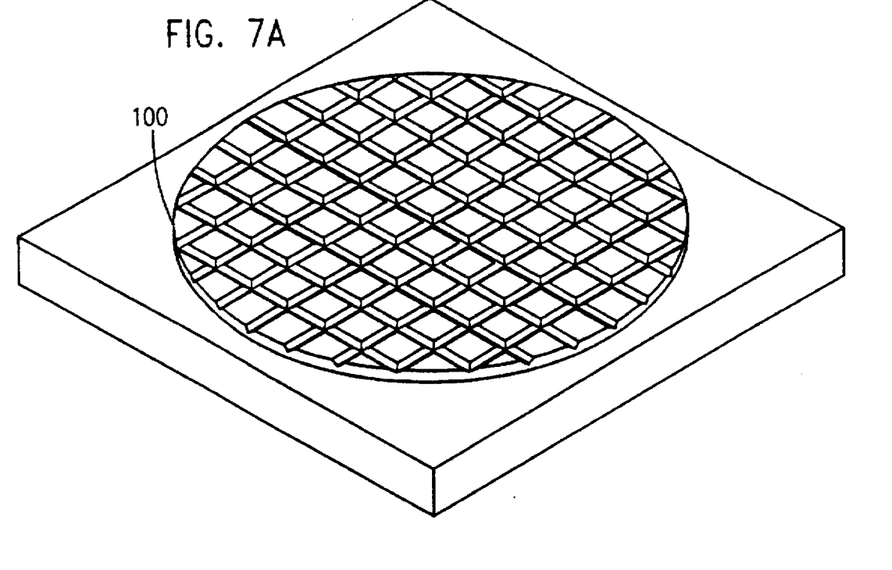
FIG. 7A is a simplified illustration of a wafer bearing multiple integrated circuit dice which is produced in accordance with a preferred embodiment of the present invention.
Figure 7B:
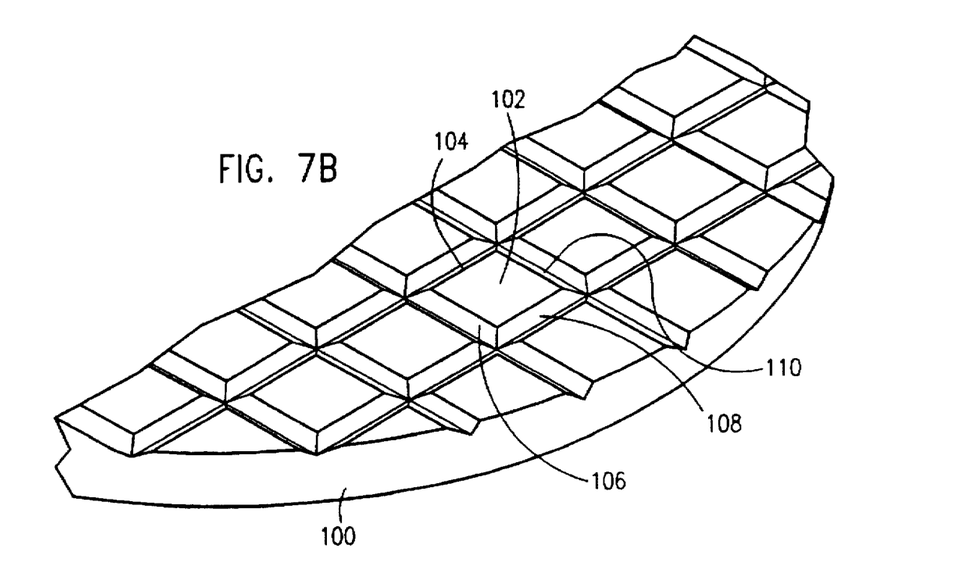
FIG. 7B is an enlarged illustration of part of the wafer of FIG. 7A.

A wafer 100 on which integrated circuits have been formed, and which has been notched to delineate individual integrated circuit dice is shown in FIGS. 7A and 7B. Alternatively, FIGS. 7A and 7B may represent an array of separated dice which are arranged in touching or near touching side-by-side relationship. Each die is seen to have a generally rectangular top facet 102 and four inclined side facets 104, 106, 108 and 110.

Wafer 100 is initially subjected to metal deposition by conventional techniques. Thereafter, a layer of photoresist is formed over the metal, preferably by an electrophoretic technique.

Figure 8A:
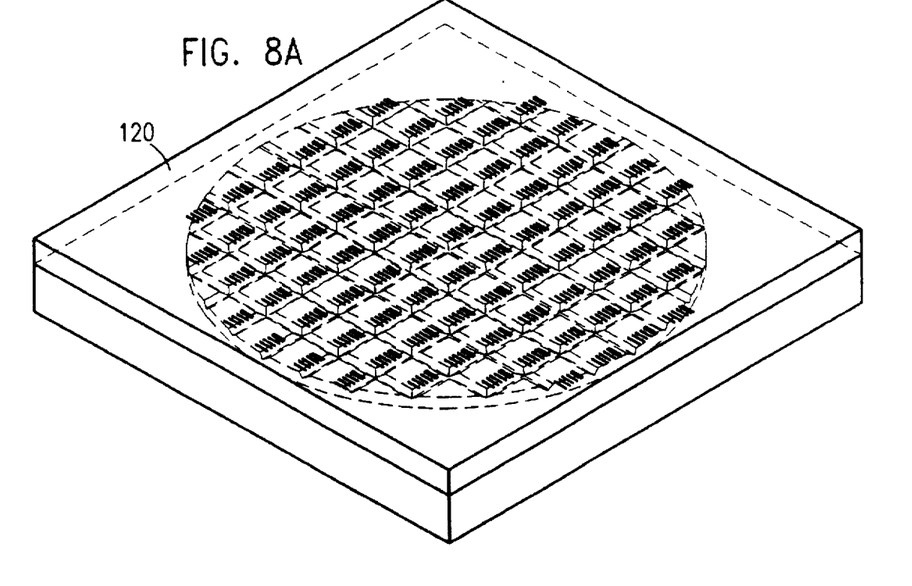
FIG. 8A is a simplified illustration of a mask used in producing the wafer of FIGS. 7A and 7B.
Figure 8B:
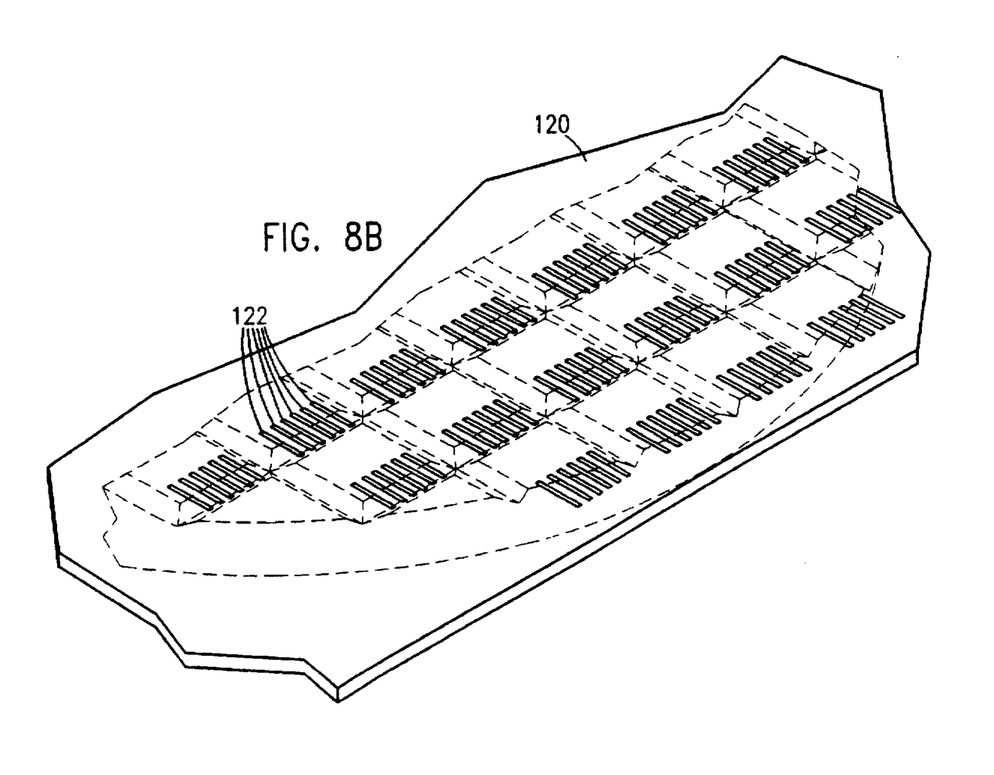
FIG. 8B is an enlarged illustration of part of the mask of FIG. 8A.
Figure 9:
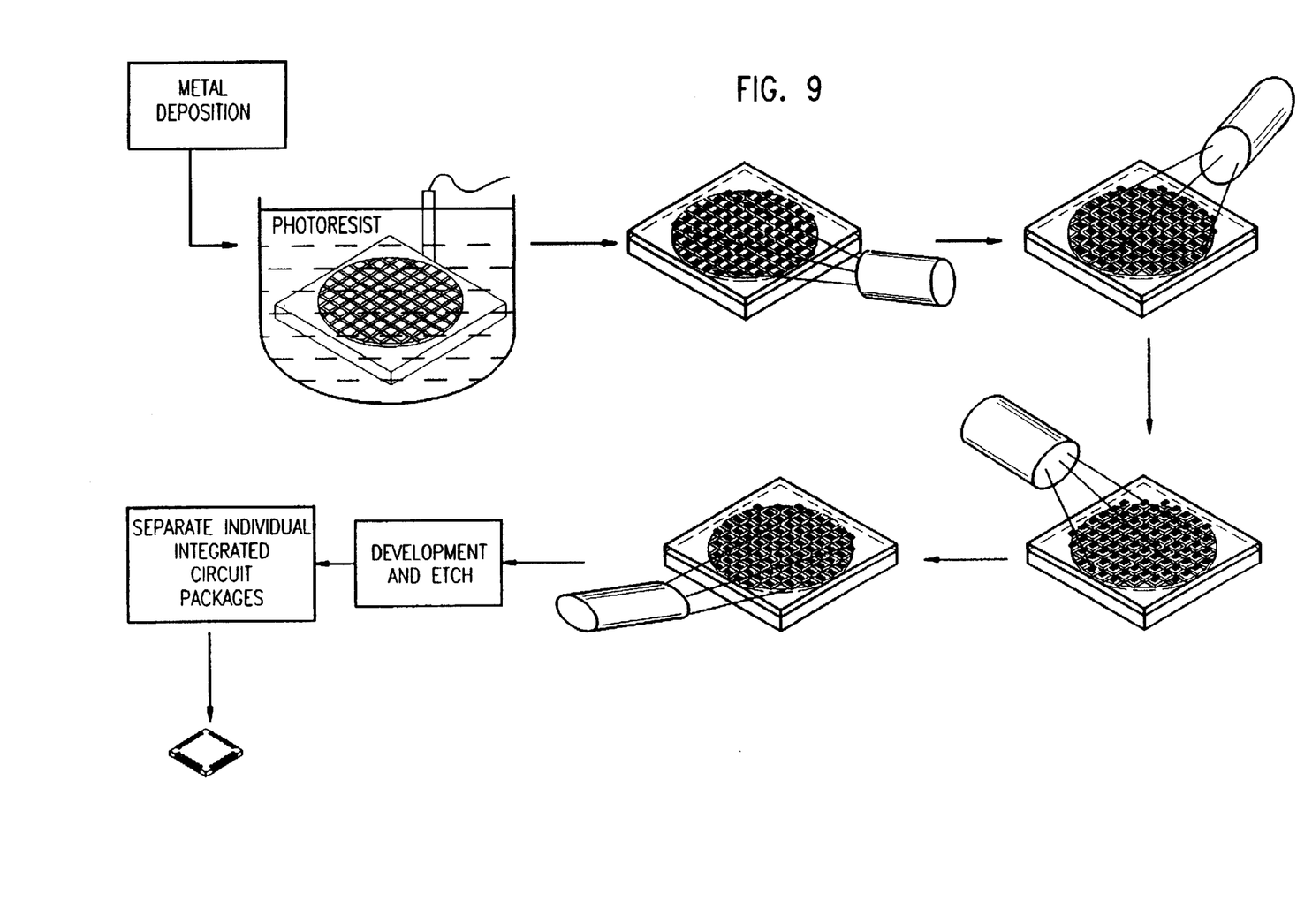
FIG. 9 is a simplified illustration of a technique for producing the wafer of FIGS. 7A and 7B in accordance with a preferred embodiment of the present invention.
Figure 10A:
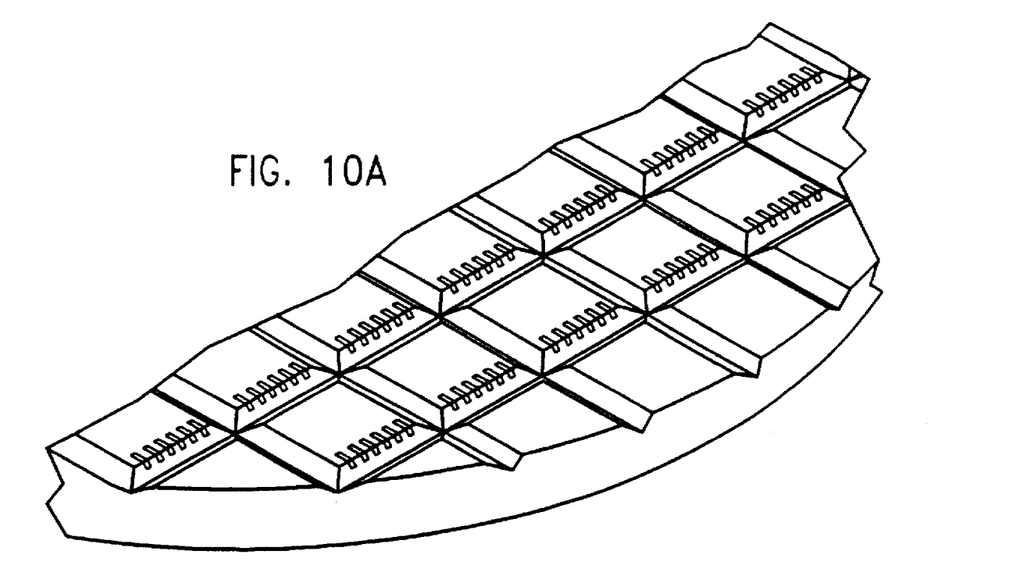
FIGS. 10A, 10B, 10C and 10D are illustrations of part of the wafer of FIGS. 7A and 7B showing the exposed areas of the photoresist following each of the four exposures in the technique of FIG. 9.
Figure 10B:
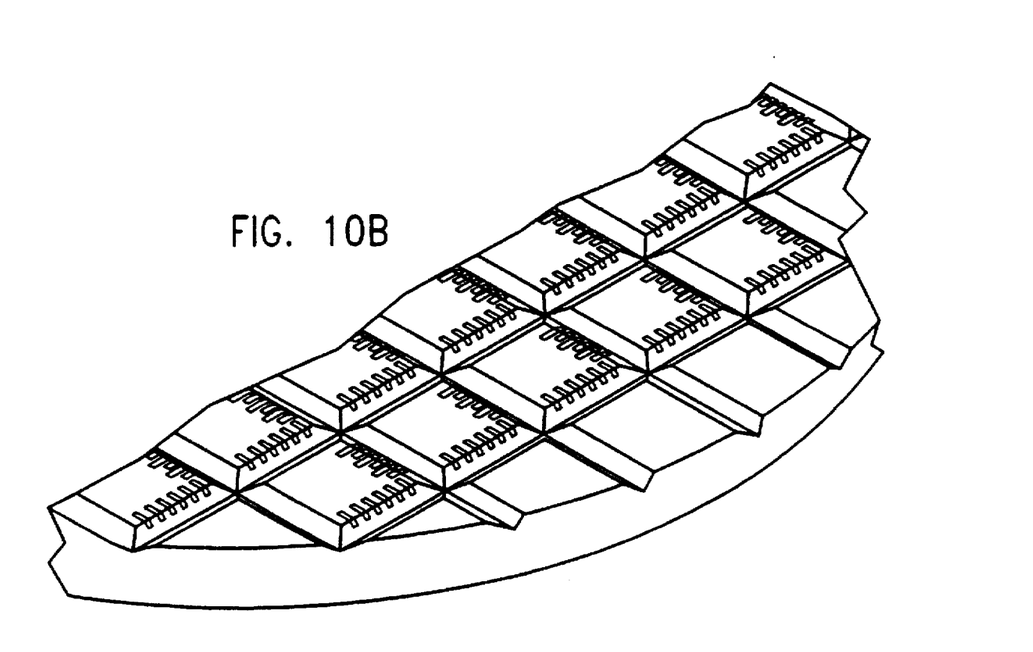
Figure 10C:
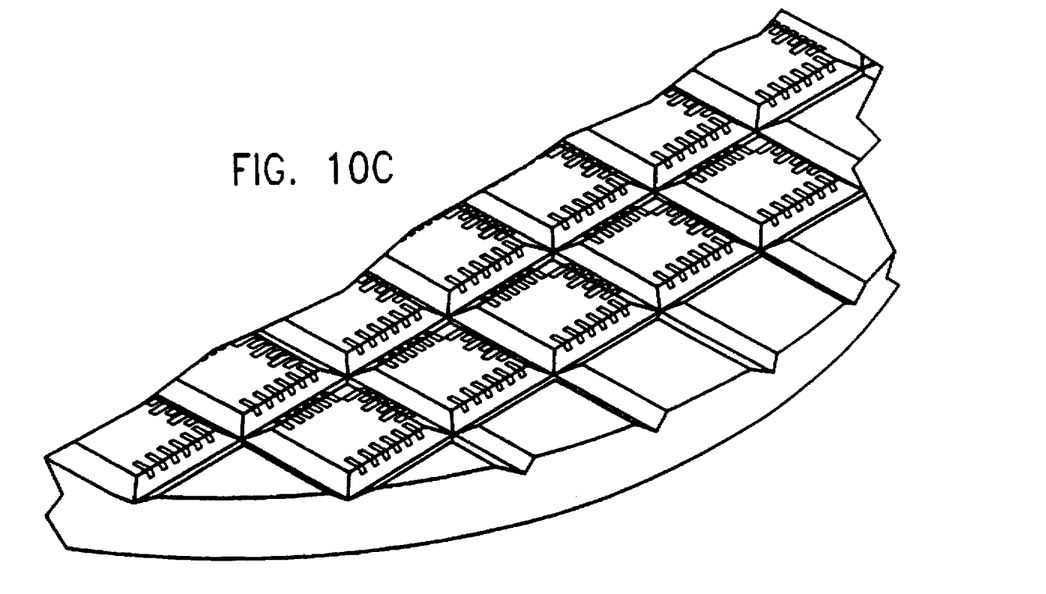
Figure 10D:
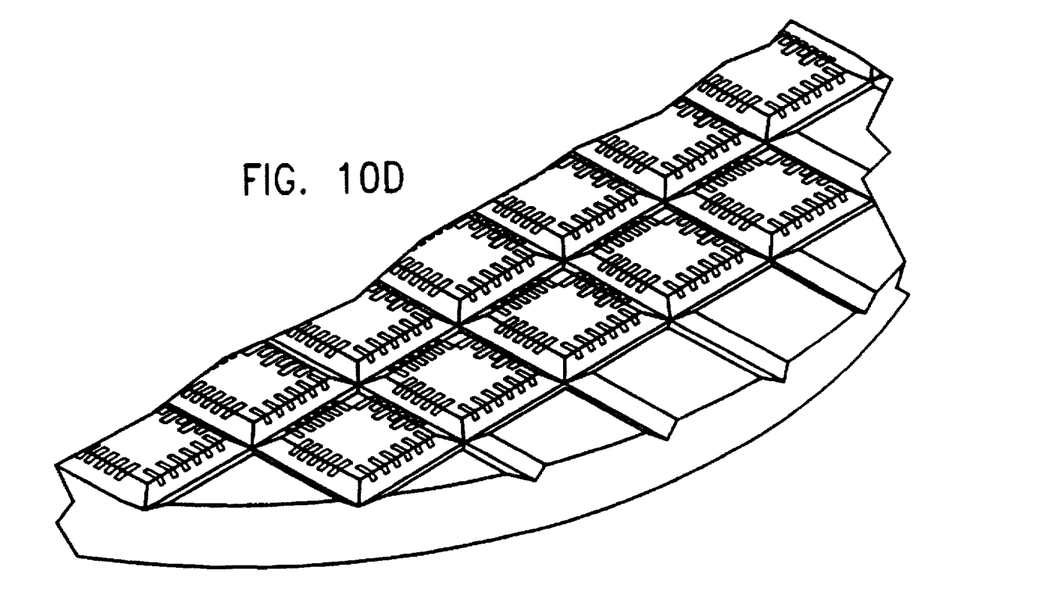

Following formation of the layer of photoresist, a mask 120, such as that illustrated in FIGS. 8A and 8B, and having longitudinal openings 122 corresponding to desired pads along one edge of top facet 102 and an adjacent side facet, is exposed with light directed generally parallel to the longitudinal axis of openings 122.

The exposure step is repeated for three sequential 90 degree rotations, either by using a different mask or by using a single mask which may have different masking patterns corresponding to each 90 degree sequential rotation. If a single mask is used, light is passed through the mask openings corresponding to the desired illuminating angle; light is prevented from entering the other mask openings which are later illuminated during sequential rotation.

The sequential exposure of the photoresist coated dice is shown in FIGS. 10A, 10B, 10C and 10D.

In this way, all four side facets 104, 106, 108 and 110 and the adjacent edges of top facet 102 are exposed to form pads thereon as desired.

Following exposure, the photoresist is developed and the dice, if not already separated, are separated.

It will be appreciated by persons skilled in the art that the present invention is not limited by what has been particularly shown and described hereinabove. Rather the scope of the present invention is defined only by the claims which follow:

I claim:

1. A method for three dimensional lithography including the steps of:
   providing a substrate having surfaces extending in three dimensions and a light sensitive coating; and
   illuminating said substrate via a mask with light impinging on said surfaces at a non-perpendicular angle with respect to the mask.

2. A method according to claim 1 and wherein said substrate comprises a plurality of integrated circuit dice having notches formed therebetween.

3. A method according to claim 2 and wherein said notches extend through the substrate and separate the dice.

4. A method according to claim 1 and wherein said substrate comprises an array of mutually spaced integrated circuits.

5. A method according to claim 1 and wherein said illuminating step comprises illuminating said substrate via a plurality of differently patterned masks.

6. A method according to claim 5 and wherein said illuminating step comprises illuminating said substrate sequentially via said plurality of differently patterned masks.

7. A method according to claim 6 and wherein each of said differently patterned masks is employed for simultaneous illumination of a plurality of integrated circuit dice.

8. A method according to claim 7 and wherein each of said differently patterned masks is employed for simultaneous illumination of plural surfaces on each of said plurality of integrated circuit dice.

9. A method according to claim 1 and wherein said illuminating step comprises illuminating said substrate via a patterned mask in a plurality of different orientations relative to said substrate.

10. A method according to claim 9 and wherein said illuminating step comprises illuminating said substrate via a patterned mask sequentially in a plurality of different orientations relative to said substrate.

11. A method according to claim 10 and wherein each of said differently patterned masks is employed for simultaneous illumination of a plurality of integrated circuit dice.

12. A method according to claim 11 and wherein said patterned mask is employed for simultaneous illumination of plural surfaces on each of said plurality of integrated circuit dice.

13. A method according to claim 1 and wherein said mask is located in proximity exposure relationship with the substrate.

14. A method according to claim 1 and wherein said mask is spaced from the substrate and optical elements are located between the mask and the substrate.

15. A method according to claim 1 and wherein said step of illuminating comprises employing a square pyramidal prism reflecting light from a illuminator onto a plurality of mutually spaced mirrors, which in turn reflect light onto edges of the substrate.

16. A method for three dimensional lithography including the steps of:
   providing a substrate having surfaces extending in three dimensions and a light sensitive coating; and
   illuminating said substrate via a mask non-perpendicularly there-through with light impinging on at least two non-mutually parallel surfaces of said substrate.

17. A method for photolithographic forming of metal areas on an integrated circuit device including the steps of:
   providing an integrated circuit device substrate having surfaces extending in three dimensions and a light sensitive coating; and
   illuminating said substrate via a mask with light impinging on said surfaces at a non-perpendicular angle with respect to the mask.

18. A method for photolithographic forming of metal areas on an integrated circuit device including the steps of:
   providing an integrated circuit device substrate having surfaces extending in three dimensions and a light sensitive coating; and
   illuminating said integrated circuit device via a mask with light impinging on said surfaces at a non-perpendicular angle with respect to the mask.

19. Apparatus for three dimensional lithography including:
   an illuminator for illuminating a substrate having surfaces extending in three dimensions and a light sensitive coating via a mask with light impinging on said surfaces at a non-perpendicular angle with respect to the mask.

20. Apparatus according to claim 19 and wherein said mask is spaced from the substrate and optical elements are located between the mask and the substrate.

21. Apparatus according to claim 19 and also comprising a camera for viewing the substrate prior to and during illumination thereof.

22. Apparatus according to claim 19 and wherein said illuminator comprises a square pyramidal prism reflecting light from a light generator onto a plurality of mutually spaced mirrors, which in turn reflect light onto edges of the substrate.

23. Apparatus according to claim 19 and wherein said mask comprises a plurality of reticles and said illuminator comprises a plurality of projection lenses receiving light from said plurality of reticles and a plurality of folding mirrors receiving light from said plurality of projection lens and directing it onto edges of said substrate.

24. Apparatus for photolithographic forming of metal areas on an integrated circuit device including:
   an illuminator for illuminating an integrated circuit device substrate having surfaces extending in three dimensions and a light sensitive coating via a mask with light impinging on said surfaces at a non-perpendicular angle with respect to the mask.

25. Apparatus according to either of claims 19 and 24 and wherein said mask is located in proximity exposure relationship with the substrate.

26. A method according to any of claims 1–12, 13 and 15 and wherein said step of illuminating comprises employing a plurality of projection lenses to receive light and direct it onto a plurality of folding mirrors which direct it onto edges of said substrate.

* * * * *